United States Patent [19]

Cochran et al.

[11] 3,999,141
[45] Dec. 21, 1976

[54] CONTROLLABLE GAIN SIGNAL AMPLIFIER

[75] Inventors: Larry Allen Cochran, Indianapolis, Ind.; Leopold Albert Harwood, Somerville, N.J.

[73] Assignee: RCA Corporation, New York, N.Y.

[22] Filed: Aug. 25, 1975

[21] Appl. No.: 607,489

[52] U.S. Cl. .............................. 330/29; 330/30 D
[51] Int. Cl.² .......................................... H03G 3/30
[58] Field of Search .................... 330/29, 30 D, 69; 358/27

[56] References Cited
UNITED STATES PATENTS

| | | | |
|---|---|---|---|
| 3,740,462 | 6/1973 | Harwood | 358/27 |
| 3,750,042 | 7/1973 | Peil et al. | 330/29 |
| 3,757,240 | 9/1973 | Fogg | 330/29 |
| 3,772,463 | 11/1973 | Wakai et al. | 358/27 |
| 3,803,505 | 4/1974 | Ishigaki et al. | 330/29 |
| 3,875,522 | 4/1975 | Hoefi | 330/30 D |
| 3,887,938 | 6/1975 | Gelchin | 358/27 |

Primary Examiner—James B. Mullins
Attorney, Agent, or Firm—Eugene M. Whitacre; Kenneth R. Schaefer; Ronald H. Kurdyla

[57] ABSTRACT

A signal amplifier is supplied with input signals at its base electrode and also is supplied at its emitter with quiescent operating current from a current source. Amplified output signals developed at the collector of the amplifier are coupled to a transistor-diode current splitter. The relative division of current in the splitter is controlled by coupling a variable direct current supply to the diode. The latter supply comprises a source of direct voltage, a variable resistive voltage divider coupled across the voltage source, and the combination of a voltage follower stage, a first series resistor coupled between the resistive divider and the input of the voltage follower and a second resistor coupled between the output of the follower and the diode. Gain controlled push-pull output signals may be provided by differentially coupling a second amplifier device to the first and coupling the output of a second current splitter to the second amplifier. The second current splitter is then also controlled by the same current source as the first.

7 Claims, 1 Drawing Figure

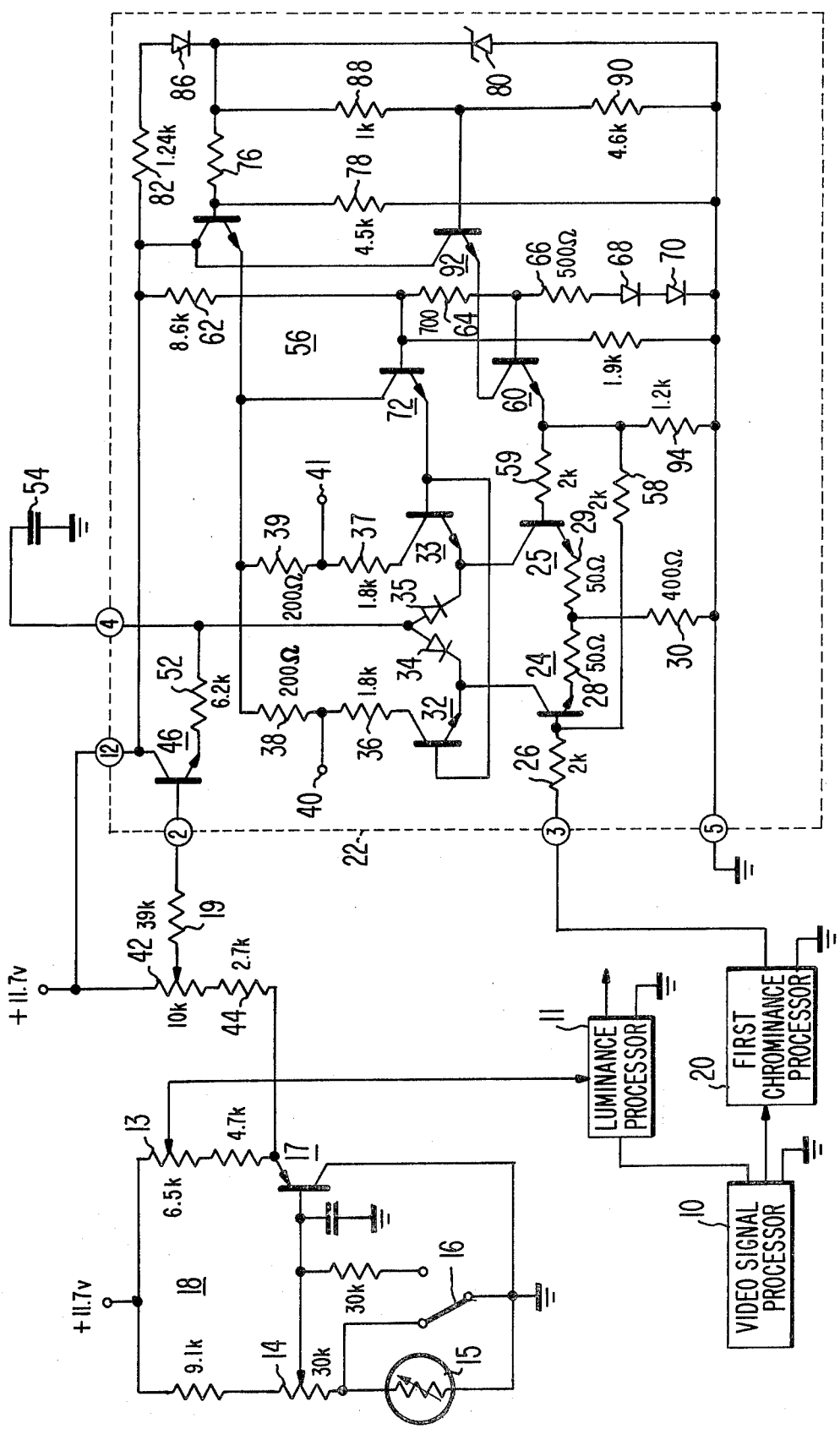

CONTROLLABLE GAIN SIGNAL AMPLIFIER

This invention relates to controllable gain electronic signal ampliifer circuits and, in particular, to circuits of this type which are particularly suitable for implementation utilizing monolithic integrated circuit construction techniques.

Controllable gain signal ampliifer circuits are widely used, for example, in television receivers to control volume, color saturation, tint and constrast functions. When a portion of such a signal processing circuit is formed as an integrated circuit and the control member is provided by an external variable resistance, a problem is encountered in providing suitable tracking or matching between the integrated and non-integrated (discrete) portions of the circuit. That is, tolerance variations of the integrated circuit elements such as resistors and of the external components are unrelated. As a result, the amplifier gain (or attenuation) at each particular setting of the variable resistance cannot be reproduced with a certainty which is desirable in mass-produced products and additional centering adjustments are required. Furthermore, manufacturing tolerances associated with transistor characteristics (i.e., $\beta$) can result in an undesirable lack of predictability of minimum gain conditions for such circuits.

A number of different approaches have been taken to solve such problems, some examples of which are described in U.S. Pat. No. 3,740,462, entitled, "Automatic Chroma Gain Control System," granted June 19, 1973, in the name of Leopold Albert Hawood, in U.S. Pat. No. 3,649,847, entitled, "Electronically Controlled Attenuation and Phase Shift Circuitry," granted Mar. 14, 1973, in the name of Allen LeRoy Limberg, and in the Linear Integrated Circuit Data Sheet, File No. 412, published by RCA Corporation, Somerville, New Jersey, which relates to the CA3065 type television sound system integrated circuit.

In the CA3065 system, a differential amplifier current splitter arrangement is used in conjunction with a d.c. potentiometer to provide audio volume control. In that type circuit, a relatively small variation in the gain control voltage (e.g., several hundred millivolts) produces a change in conduction from one extreme to the other in the current splitter.

In the Limberg patent, several circuit arrangements are described which employ a combination of a diode and a transistor coupled together in a differential or current splitter configuration. Signal current is supplied to the junction of the emitter of the transistor and one electrode of the diode. Conductivity of the diode and consequent division of the signal current between the diode and the transistor is controlled by means of a variable direct current supply including a variable resistance coupled to the second electrode of the diode. While such arrangements exhibit a number of desirable characteristics, as compared to the two transistor current splitters of the CA3065 type, additional characteristics such as constant loading on the signal current supply, a linear relationship between the setting of the variable resistance control and the output signal current and a readily predictable end point or zero gain condition are desirable in certain applications. For example, in the Harwood patent referred to above, a manual chroma signal gain control for use in a color television receiver is disclosed. In that case, the quiescent current supply of a differential signal amplifier is varied according to the setting of a potentiometer. The potentiometer wiper is coupled via a follower transistor and a series resistor to a diode. The diode is coupled across the base-emitter junction of the quiescent current supply transistor of the amplifier in a current mirror type of arrangement. In that case, a substantially linear relationship between potentiometer setting and amplifier signal gain is provided. However, impedance characteristics of the amplifier transistors, including reactive components such as capacitance, can change as the potentiometer setting is varied. When the signals which are controlled are at sufficiently high frequencies (such as a color subcarrier frequency of 3.58 MHz), these impedance variations can be significant. Specifically, in the context of a chroma signal processing system of a color television receiver, such capacitance variations can introduce undesired differential phase shifts in the chroma signals as a function of the gain control setting. These phase shifts can result in an error in hue (tint) of a reproduced scene if they are introduced at a point in the signal processing chain such that the chroma signals but not the reference burst component are varied in phase.

One advantageous arrangement for avoiding such problems in a chroma signal gain (saturation) control is described in U.S. patent application Ser. No. 530,405, filed Dec. 6, 1974, in the names of L. A Harwood and E. J. Wittmann.

In addition to the above-noted factors, it is also considered advantageous to provide "tracking" between color saturation and contrast controls or to provide a single "picture" control such that luminance and chrominance drive signals are maintained in a desired proportion throughout a useful control range.

Arrangements of the latter type are described, for example, in U.S. patent application Ser. No. 588,690, now U.S. Pat. No. 3,961,361, filed May 23, 1975, in the names of J. Avins and B. J. Yorkanis.

As is explained by Avins and Yorkanis, the zero gain condition of such contrast and saturation controls should be readily predictable so that contrast and saturation both reach minimums substantially simultaneously rather than having either monochromatic or oversaturated images when the picture control is adjusted near the minimum gain condition.

In accordance with the present invention, a controllable gain signal amplifier comprises at least first, second and third signal amplifying devices coupled in a differential signal amplifying configuration. The first device supplies operating current to the other two and at least the first and second devices exhibit a current gain parameter $\beta$. A signal input terminal, a signal output terminal and a gain control terminal are coupled to the signal amplifying configuration. A gain controlling arrangement is coupled to the gain control terminal and comprises a source of direct voltage and a variable voltage divider coupled across the source and having an output terminal at which a selected portion of the voltage is provided. A voltage follower transistor exhibiting a current gain parameter similar to that of the first and second devices is associated with the gain controlling means and includes an output electrode direct current coupled to the gain control terminal. Further means are direct current coupled from the output terminal of the voltage divider to the input electrode of the follower transistor for varying gain control signals supplied to the control terminal so as to compensate for variations in the current gain parameter from a nominal condition.

Additional aspects of the present invention will be more readily understood from a reading of the following description in connection with the accompanying drawing which is a detailed schematic representation, partially in block form, of chrominance and luminance signal processing apparatus suitable for construction at least partially in integrated circuit form, which embodies the present invention.

Referring to the drawing, composite television signals including at least luminance and chrominance signal components are supplied by a video signal processor 10. The luminance components are coupled to a luminance processor 11 which typically includes a gain controllable amplifier which may be of the type described in the above-mentioned Avins and Yorkanis application. The luminance signal gain of processor 11 is set by means of a gain control unit 18 which includes a contrast control potentiometer 13, a "picture" control potentiometer 14 and a light dependent variable resistor (LDR) 15 arranged as illustrated. A switch 16 for enabling and disabling operation of LDR 15 preferably is also provided. A positive control voltage provided at the wiper of picture control 14 is coupled via a PNP emitter follower transistor 17 to one end of contrast control 13, the other end of which is coupled to a positive supply voltage source (e.g., +11.7 V).

Chrominance signal components supplied by video signal processor 10 are coupled to a first chrominance signal processor 20, the output of which is coupled to a terminal 3 of a second chrominance signal processing circuit indicated generally by a reference numeral 22.

In the context of a color television receiver, a suitable first chrominance processor 20 is provided by the commercially available RCA Corporation CA3126 integrated circuit and associated components. The second chrominance signal processing circuit 22, which is also suitable for construction in integrated circuit form, would include appropriate chrominance signal demodulation circuitry (not shown) in addition to a gain controllable amplifier to be described herein.

The illustrated amplifier comprises a first transistor 24 having a signal input (base) electrode coupled to terminal 3 by a resistor 26. The main current conduction path (collector-emitter) of transistor 24 is coupled via a degeneration resistor 28 to a further resistor 30 which, in turn, is coupled via a terminal 5 to a reference or ground potential. Resistor 30, in conjunction with an external voltage supply (e.g., +11.7 volts) coupled between ground terminal 5 and a B+ supply terminal 12, provides a source of quiescent operating current for transistor 24 and the remainder of the amplifier as will appear below.

A current splitter circuit comprising a second transistor 32 and a semiconductor rectifier device or diode 34 is coupled to the collector of transistor 24. Diode 34 and the base-emitter junction of transistor 32 are poled in the same direction with respect to the flow of collector current in transistor 24. Diode 34 may be fabricated, for example, as a transistor identical to transistor 32 but with collector shorted to base. The conduction characteristics of the two devices then will be substantially matched.

An output load circuit illustrated as series connected resistors 36 and 38 is coupled between the collector of transistors 34 and a source of operating voltage, details of which will be explained below. Amplified chroma output signals are provided at output terminal 40 for coupling, or example, to a following demodulator circuit (not shown).

The signal gain associated with the cascode combination of transistors 24 and 32 is controlled by means of a potentiometer or variable voltage divider resistor 42 coupled externally to signal processing circuit 22 between the B+ supply and ground terminals. Resistor 42 is returned to ground via an end limit resistor 44 and the gain control unit 18 as illustrated. A wiper arm of potentiometer 42 is direct current coupled via a resistor 19 and a terminal 2 to the base of a third transistor 46 within circuit 22. Resistor 19 is provided to reduce the effect of $\beta$ variations of transistors included in circuit 22 on the cutoff point of the current splitters as will be explained below. Direct control current is supplied from the emitter of transistor 46 to diode 34 via a series resistor 52. A signal by pass circuit comprising a capacitance 54 is coupled from a terminal 4 to ground, the terminal 4 being coupled within circuit 22 to the junction of resistor 52 and diode 34.

Bias potentials and currents are supplied to the above-described amplifier arrangement by means of a plurality of voltage divider circuits, indicated generally by the reference numeral 56, connected between terminals 12 (B+) and 5 (ground). Specifically, base bias is supplied to first transistor 24 via a resistor 58 and a follower transistor 60 by means of a voltage divider comprising resistors 62, 64, 66 and compensating diodes 68, 70. The base of follower transistor 60 is coupled to the junction of resistors 64 and 66. Base bias voltage is supplied to transistor 32 by means of a second follower transistor 72 having its base coupled to the junction of resistors 62 and 64 (e.g., approximately one $V_{be}$ higher than the base of transistor 60). Appropriate B+ (collector supply) voltages are provided to transistors 32 and 72 by means of a third follower transistor 74. The base of transistor 74 is coupled to the junction of divider resistors 76 and 78, the series combination of which is coupled across a zener diode 80. Current is supplied to zener diode 80 from the supply terminal 12 via resistor 82 and diode 86.

A second divider comprising resistors 88 and 90 is coupled across zener diode 80. The junction of the resistors 88 and 90 is coupled to a follower transistor 92 which is arranged to supply operating collector voltage to transistor 60.

The illustrated amplifier also includes a further amplifier-current splitter configuration like that described above but which provides oppositely phased output signals at a terminal 41. That is, current source resistor 30 is also coupled to the emitter-collector path of a transistor 25 via a resistor 29, the transistors 24 and 25 providing a differential amplifier. The collector of transistor 25 is coupled to a second current splitter comprising a transistor 33 and a diode 35. Series-connected load resistors 37 and 39 are coupled to the collector of transistor 33 and output terminal 41 is provided at the junction of resistors 37 and 39. Similar electrodes (i.e., anodes) of diodes 34 and 35 are connected in common to resistor 52. Furthermore, the bases of transistors 32 and 33 are coupled in common to the bias voltage provided at the emitter of follower transistor 72.

Similarly, the base of transistor 25 is coupled to the emitter of follower transistor 60 by means of a resistor 59 substantially equal in value to resistor 58. A resistor 94 also is coupled from the emitter of transistor 60 to terminal 5 (ground).

Neglecting for the moment the gain control circuit 18 and resistor 19, the operation of the circuit of FIG. 1 will be described for typical operating parameters consistent with the component values shown in FIG. 1 and consistent with a B+ voltage supply of +11.7 volts. In that case, a nominal operating current of, for example, approximately 1.2 milliamperes is provided through resistor 30. In the absence of input signal, this current will divide substantially equally between the similarly biased transistors 24 and 25. If the gain control adjusting potentiometer 42 is set at one limit (at the connection to resistor 44), component values are arranged such that transistor 46 is effectively cut off and no current will flow in resistor 52 and diodes 34, 35. In that case, neglecting the normally small difference between collector and emitter currents of NPN transistors, the collector currents of transistors 24 and 25 will flow, respectively, in transistors 32 and 33. The transistors 32 and 33 are operated in common base mode and form cascade signal amplifiers with their associated transistors 24 and 25. This arrangement provides the highly desirable effect of low collector-base feedback capacitance and substantially no variation in phase shift of the signals at output terminals 40 and 41 as potentiometer 42 is varied. With this setting of potentiometer 42, one-half of the quiescent current from resistor 30 flows in each of the load circuits and maximum gain for signals supplied from source 20 is provided.

As the wiper arm of potentiometer 42 is moved towards the B+ terminal, transistor 46 will begin to conduct. Transistor 46 will conduct when the voltage at the base of transistor 46 approaches the bias voltage supplied to the bases of transistors 32 and 33 of the current splitters. By selection of the circuit parameters, diodes 34 and 35 may be arranged to conduct all of the quiescent operating current supplied via resistor 30 when potentiometer 42 is set approximately at B+, thereby cutting off transistors 32 and 33 to provide no output signals at terminals 40 and 41. It is desirable to produce the maximum attenuation when the wiper is approximately at the B+ end of potentiometer 42 so as to reduce the possibility of any dead spots or unpredictability in operation of the circuit. To this end, the value of resistor 52 is selected so that the product of that resistance and the total current through resistor 30 (e.g., 1.2 milliamperes) is slightly greater (e.g., a few hundred millivolts greater) than the B+ voltage minus the base-emitter voltage ($V_{be}$) of transistor 46 minus the base bias voltage of transistors 32 and 33.

At settings of potentiometer 42 intermediate those corresponding to cutoff of transistors 32 and 33 on the one hand and cutoff of diodes 34 and 35 on the other hand, the voltage gain of the illustrated amplifier will vary in a substantially linear manner with respect to rotation of the potentiometer 42.

The relationship of gain control circuit 18 and the significance of resistor 19 to the above-described circuit will now be considered.

In adjusting the gain control circuit 18, switch 16 is placed in the illustrated position corresponding to manual setting of the picture characteristics. Picture control 14 is set to its lowermost limit (ground potential) and contrast control 13 is adjusted to provide a desired maximum luminance signal gain (contrast). Color saturation control 42 is then adjusted to provide a desired degree of color saturation. Thereafter, as the picture control 14 is adjusted towards its upper limit (towards 11.7 volts), luminance and chrominance are adjusted simultaneously and proportionally towards zero level. Switching of switch 16 to its alternate position causes LDR 15 to be placed in circuit and thereby causes saturation and contrast to respond to ambient light conditions as is explained in the Avins and Yorkanis application noted above.

It is desirable that the luminance and chrominance signal gains both reach zero for a predetermined setting of potentiometer 14. However, it has been observed that the cutoff point associated with the illustrated chrominance signal amplifier is dependent to some extent upon the $\beta$ of the included transistors. For example, where the transistors 24 and 25 exhibit a relatively low $\beta$ (such as 30–40), the base-emitter voltage drop will be greater and the resultant current in resistor 30 will be less than in the case where the transistor $\beta$ is greater (such as 150–180). It may also be observed that low $\beta$ transistors require a greater base current to produce a given emitter current and therefore such lower $\beta$ units will also result in a lower current in resistor 30 because of a greater voltage drop across resistors 58 and 59.

Thus, when lower $\beta$ transistors are included in the circuit, transistors 32 and 33 will be cut off at a control voltage input less than the nominal cutoff value (e.g., 11.7 volts). However, the luminance processor 11 may be expected to still provide luminance signal gain until potentiometer 14 is adjusted to its end point. In that case, the picture control 14 may be said to be reducing chrominance gain faster than the luminance gain, thereby providing a relatively desaturated image for certain settings of control 14. The addition of resistor 19 in the base circuit of transistor 46 avoids this undesired effect.

That is, when each of transistors 24, 25 and 46 is a high $\beta$ transistor, relatively low base current flows through resistor 19 and the voltage at the wiper of color control 42 is coupled substantially unattenuated to the base of transistors 46. If on the other hand, transistors 46, 24 and 25 are low $\beta$ units, the base current flowing through resistor 19 causes a drop in the voltage coupled from the wiper of control 42 to the base of transistor 46. This drop is in the appropriate direction to provide cutoff of the expected smaller current in transistors 32 and 33 when the wiper of control 42 is at or near 11.7 volts. The value of resistor 19 may be selected to provide a desired degree of consistency in the effective cutoff voltage.

Where the circuit 22 is constructed in monolithic integrated form, it may be expected that a given wafer of such circuits will include a plurality of transistors all of which are of substantially similar $\beta$ characteristics.

It should also be noted that the cascode connection of transistors 24, 32 and 25, 33 provides excellent response characteristics in the frequency range of the normal color signals (i.e., 2–4 MHz). Furthermore, the circuit provides the desired characteristic of very low differential phase shift as the setting of potentiometer 42 is varied. The impedance of the combination of diode 34 and transistor 32 on the one hand and the combination of diode 35 and transistor 33 on the other hand are substantially constant as the potentiometer 42 is varied.

It should further be noted that the maximum gain condition (potentiometer 42 wiper close to ground) can be determined by choosing the resistance of end resistor 44 with respect to the total resistance of potentiometer 42 so that the minimum potentiometer output voltage is approximately equal to the base bias voltage of transistors 32 and 33.

It should be observed that, due to the symmetry of the load circuits associated with transistors 24 and 25, the single control potentiometer 42 provides substantially equal effects on the outputs at terminals 40 and 41. The resulting gain controlled push-pull output signals are desirable for application to subsequent demodulator circuits (not shown).

In addition to the customer operated saturation control, direct control current supplied by automatic control circuits also may be coupled to terminal 4 to vary the signal gain. For example, it may be desirable to bias a chroma signal amplifier to cutoff when low brightness image information is present in the accompanying luminance channel (not shown) of a color television receiver. In that case, sufficient direct current would be supplied to terminal 4 to bias diodes 34 and 35 fully on, cutting off transistors 32 and 33 and thereby reduce any tendency to produce chroma "noise" in low brightness scenes.

Other modifications and additions may also be made to the illustrated arrangement without departing from the scope of the present invention. For example, a PNP follower may be inserted between potentiometer 42 and the base of transistor 46 to provide improved temperature characteristics of the illustrated control arrangement.

What is claimed is:

1. A controllable gain signal amplifier comprising:
    at least first, second and third semiconductor devices coupled in a differential signal amplifying configuration, said first device conducting operating current for said second and third devices, at least said first and second devices exhibiting a current gain parameter $\beta$;
    a signal input terminal coupled to said signal amplifying configuration;
    a gain control terminal coupled to said signal amplifying configuration;
    a signal output terminal coupled to said signal amplifying configuration;
    gain controlling means coupled to said gain control terminal for varying the amplitude of direct current flow through at least said second device, said gain controlling means comprising:
    a source of direct voltage;
    a variable voltage divider coupled across said source and having an output terminal at which a selected portion of said voltage is provided;
    coupling means including a voltage follower transistor exhibiting a current gain parameter similar to that of said devices and further having input and output electrodes, means direct current coupling said output electrode to said gain control terminal to apply gain control signals thereto, and means direct current coupled from said output terminal of said voltage divider to said input electrode of said follower transistor for varying said gain control signals supplied to said control terminal so as to compensate for differences in said parameter from a nominal condition.

2. A controllable gain signal amplifier according to claim 1 wherein:
    said means direct current coupled to said input electrode of said follower transistor comprises a series resistance through which input current for said follower transistor is supplied.

3. A controllable gain signal amplifier according to claim 2 wherein:
    said input and output electrodes of said follower transistor correspond, respectively, to base and emitter electrodes, said series resistance being arranged to conduct base current of said follower transistor.

4. A controllable gain signal amplifier according to claim 3 wherein:
    said third semiconductor device is arranged as a two terminal rectifier; and
    said gain control terminal is coupled to said rectifier.

5. A controllable gain signal amplifier according to claim 4 wherein:
    said means direct current coupling said output electrode to said gain control terminal comprises a second series resistance for supplying direct current gain control signals to said rectifier.

6. A controllable gain signal amplifier according to claim 5 wherein:
    said signal input terminal is coupled to said first device; and
    said signal output terminal is coupled to said second device.

7. A controllable gain signal amplifier according to claim 6 wherein:
    said first and second devices each have base, emitter and collector electrodes;
    said input electrode corresponds to said base electrode of said first device; and
    said output electrode corresponds to said collector electrode of said second device.

* * * * *